(12) United States Patent
Kumfer et al.

(10) Patent No.: US 7,508,096 B1
(45) Date of Patent: Mar. 24, 2009

(54) SWITCHING CIRCUIT APPARATUS HAVING A SERIES CONDUCTION PATH FOR SERVICING A LOAD AND SWITCHING METHOD

(75) Inventors: Brent Charles Kumfer, Farmington, CT (US); Robert Keith Hollenbeck, Fort Wayne, IN (US)

(73) Assignee: General Electric Company, Schenectady, NY (US)

(*) Notice: Subject to any disclaimer, the term of this patent is extended or adjusted under 35 U.S.C. 154(b) by 0 days.

(21) Appl. No.: 11/858,402

(22) Filed: Sep. 20, 2007

(51) Int. Cl.
*H01H 67/00* (2006.01)
*H01H 71/08* (2006.01)

(52) U.S. Cl. .................. 307/140; 307/112; 307/139
(58) Field of Classification Search .................. 307/140
See application file for complete search history.

(56) References Cited

U.S. PATENT DOCUMENTS

| | | | |
|---|---|---|---|
| 3,496,409 A | | 2/1970 | Connell |
| 3,671,775 A | * | 6/1972 | Kam .................. 327/116 |
| 4,384,289 A | | 5/1983 | Stillwell et al. |
| 4,471,422 A | * | 9/1984 | Hierholzer, Jr. ......... 363/56.08 |
| 4,723,187 A | | 2/1988 | Howell |
| 4,827,272 A | | 5/1989 | Davis |
| 4,847,780 A | | 7/1989 | Gilker et al. |
| 4,893,070 A | * | 1/1990 | Milberger et al. ........... 323/270 |
| 5,374,792 A | | 12/1994 | Ghezzo et al. |
| 5,426,360 A | | 6/1995 | Maraio et al. |
| 5,430,597 A | | 7/1995 | Bagepalli et al. |
| 5,444,610 A | * | 8/1995 | Gaudreau et al. ............. 363/54 |
| 5,454,904 A | | 10/1995 | Ghezzo et al. |
| 5,502,374 A | | 3/1996 | Cota |
| 5,550,520 A | * | 8/1996 | Kobayashi .................. 333/213 |
| 5,574,320 A | * | 11/1996 | Shirai et al. .................. 307/131 |

(Continued)

FOREIGN PATENT DOCUMENTS

EP       0774822 A1     5/1997

(Continued)

OTHER PUBLICATIONS

"Power Circuit Breaker Using Micro-Mechanical Switches"; Authors: George G. Karady and Gerald Thomas Heydt; Int J. Critical Infrastructure, vol. 3, Nos. 1/2, 2007; pp. 88-100; XP008087882.

(Continued)

*Primary Examiner*—Stephen W Jackson
*Assistant Examiner*—Adi Amrany
(74) *Attorney, Agent, or Firm*—Cantor Colburn LLP

(57) ABSTRACT

A circuit for servicing a load connectable with a power supply is disclosed. The circuit includes a plurality of three-terminal switches and one control supply. The three-terminal switches define a series conduction path connectable between the power supply and the load. Each of the plurality of three terminal switches includes a source terminal, a drain terminal, and a gate terminal. The control supply is productive of a control voltage and in power connection between the gate terminal and source terminal of each of the plurality of three-terminal switches. Each of the plurality of three-terminal switches is responsive to the control voltage at its respective gate terminal to close a connection between the respective source terminal and respective drain terminal of each of the plurality of three-terminal switches.

19 Claims, 7 Drawing Sheets

U.S. PATENT DOCUMENTS

| | | | |
|---|---|---|---|
| 5,889,643 A | | 3/1999 | Elms |
| 5,940,260 A | | 8/1999 | Gelbien et al. |
| 5,943,223 A | | 8/1999 | Pond |
| 5,949,122 A | * | 9/1999 | Scaccianoce ............... 257/469 |
| 5,973,896 A | | 10/1999 | Hirsh et al. |
| 6,008,549 A | * | 12/1999 | Cooper et al. ............... 307/125 |
| 6,034,449 A | * | 3/2000 | Sakai et al. ................ 307/139 |
| 6,054,659 A | | 4/2000 | Lee et al. |
| 6,097,761 A | * | 8/2000 | Buhring et al. ............. 375/257 |
| 6,222,350 B1 | * | 4/2001 | Mosley ....................... 323/231 |
| 6,275,366 B1 | | 8/2001 | Gelbien et al. |
| 6,563,683 B1 | | 5/2003 | Strumpler |
| 6,636,079 B2 | * | 10/2003 | Koyama ........................ 327/7 |
| 6,713,991 B1 | * | 3/2004 | McCallum ................. 323/226 |
| 6,738,246 B1 | | 5/2004 | Strumpler |
| 2001/0014949 A1 | | 8/2001 | Leblanc |
| 2002/0008149 A1 | | 1/2002 | Riley et al. |
| 2002/0145841 A1 | | 10/2002 | Williams et al. |
| 2003/0050737 A1 | | 3/2003 | Osann, Jr. |
| 2003/0212473 A1 | | 11/2003 | Vandevanter |
| 2004/0032320 A1 | | 2/2004 | Zalitzky et al. |
| 2004/0113713 A1 | | 6/2004 | Zipper et al. |
| 2004/0263125 A1 | | 12/2004 | Kanno et al. |
| 2005/0085928 A1 | | 4/2005 | Shani |
| 2005/0162140 A1 | * | 7/2005 | Hirst .......................... 323/273 |
| 2005/0248340 A1 | | 11/2005 | Berkcan et al. |
| 2005/0270014 A1 | | 12/2005 | Zribi et al. |
| 2005/0280458 A1 | * | 12/2005 | Leung et al. ................ 327/172 |
| 2006/0121785 A1 | | 6/2006 | Caggiano et al. |
| 2006/0187688 A1 | | 8/2006 | Tsuruya |
| 2006/0202933 A1 | | 9/2006 | Pasch et al. |
| 2007/0013357 A1 | | 1/2007 | Huang et al. |
| 2007/0057746 A1 | | 3/2007 | Rubel |
| 2007/0142938 A1 | | 6/2007 | Huang |
| 2007/0173960 A1 | | 7/2007 | Kumar |

FOREIGN PATENT DOCUMENTS

| | | |
|---|---|---|
| EP | 1610142 A1 | 12/2005 |
| EP | 1643324 A2 | 4/2006 |
| GB | 2123627 A | 2/1984 |
| WO | 9946606 A2 | 9/1999 |
| WO | 0004392 A1 | 1/2000 |
| WO | 2006078944 A2 | 7/2006 |
| WO | 2006100192 A1 | 9/2006 |

OTHER PUBLICATIONS

"MEMS Based Electronic Circuit Breaker as a Possible Component for and Electrical Ship", Authors: George G. Karady and Gerald T. Heydt; IEEE Electric Ship Technologies Symposium, 2005; pp. 214-218; XP-002468154.

"Advanced MEMS for High Power Integrated Distribution Systems"; Authors: Rahim Kasim, Bruce C. Kim and Josef Drobnik; IEEE Computer; Proceedings of the International Conference on MEMS, NANO and Smart Systems, 2005; pp. 1-6.

PCT International Search Report; International Application No. PCT/US2007/014379; International Filing Date Jun. 20, 2007; Date of Mailing Feb. 11, 2008.

PCT International Search Report; International Application No. PCT/US2007/071644; International Filing Date Jun. 20, 2007; Date of Mailing Feb. 13, 2008.

PCT International Search Report; International Application No. PCT/US2007/071624; International Filing Date Jun. 20, 2007; Date of Mailing Feb. 18, 2008.

PCT International Search Report; International Application No. PCT/US2007/071627; International Filing Date Jun. 20, 2007; Date of Mailing Feb. 29, 2008.

PCT International Search Report; International Application No. PCT/US2007/071630; International Filing Date Jun. 20, 2007; Date of Mailing Mar. 7, 2008.

PCT Written Opinion of the International Searching Authority; International Application No. PCT/US2007/071630; International Filing Date Jun. 20, 2007; Date of Mailing Mar. 7, 2008.

PCT International Search Report; International Application No. PCT/US2007/071632; International Filing Date Jun. 20, 2007; Date of Mailing Feb. 29, 2008.

PCT Written Opinion of the International Searching Authority; International Application No. PCT/US2007/071632; International Filing Date Jun. 20, 2007; Date of Mailing Feb. 29, 2008.

PCT International Search Report; International Application No. PCT/US2007/014363; International Filing Date Jun. 20, 2007; Date of Mailing Mar. 4, 2008.

PCT International Search Report; International Application No. PCT/US2007/071656; International Filing Date Jun. 20, 2007; Date of Mailing Mar. 12, 2008.

PCT International Search Report; International Application No. PCT/US2007/071654; International Filing Date Jun. 20, 2007; Date of Mailing Mar. 13, 2008.

PCT International Search Report; International Application No. PCT/US2007/014362; International Filing Date Jun. 20, 2007; Date of Mailing Mar. 20, 2008.

PCT International Search Report; International Application No. PCT/US2007/071643; International Filing Date Jun. 20, 2007; Date of Mailing Feb. 8, 2008.

PCT Written Opinion of the International Searching Authority; International Application No. PCT/US2007/071643; International Filing Date Jun. 20, 2007; Date of Mailing Feb. 8, 2008.

"Novel Concept for Medium Voltage Circuit Breakers Using Microswitches"; Authors: George G. Karady and G.T. Heydt; IEEE Transactions on Power Delivery, vol. 21, No. 1, Jan. 2006; pp. 536-537.

European Search Report; Application No. 07110554.8; Date of Mailing Oct. 30, 2007.

USPTO Office Action dated Oct. 17, 2008; Filing Date: Jun. 19, 2007; First Named Inventor: William James Premerlani; Confirmation No. 6421.

USPTO Office Action dated Oct. 24, 2008; Filing Date: Jun. 15, 2007; First Named Inventor: William James Permerlani; Confirmation No. 4167.

USPTO Office Action dated Oct. 28, 2008; Filing Date: Jun. 8, 2007; First Named Inventor: Cecil Rivers, Jr.; Confirmation No. 7895.

English Abstract for DE19927762 published on Jan. 4, 2001 corresponding to the non-English language copy cited in the IDS filed on May 12, 2008.

English Abstract for DE19850397 published on May 11, 2000 corresponding to the non-English language copy cited in the IDS filed on May 12, 2008.

English Abstract for EP0072422 published on Feb. 23, 1983 corresponding to the non-English language copy cited in the IDS filed on May 12, 2008.

English Abstract for EP1255268 published on Nov. 6, 2002 corresponding to the non-English language copy cited in the IDS filed on May 12, 2008.

English Abstract for EP1681694 published on Jul. 19, 2006 corresponding to the non-English language copy cited in the IDS filed on May 12, 2008.

\* cited by examiner

SWITCHING CIRCUIT APPARATUS HAVING A SERIES CONDUCTION PATH FOR SERVICING A LOAD AND SWITCHING METHOD

BACKGROUND OF THE INVENTION

Embodiments of the invention relate generally to a three-terminal switching device for controlling current in a conduction path, and more particularly to a plurality of switching devices in series connection within the conduction path.

Common three-terminal switches (such as metal-oxide-semiconductor field-effect transistor (MOSFET), insulated gate bipolar transistor (IGBT), and micro electromechanical system (MEMS) switches for example) typically include a source, drain, and gate terminal. The source terminal typically includes a connection that is responsive to application of a control voltage at the gate terminal relative to the potential at the source terminal to close the conduction path between the source terminal and the drain terminal. Three-terminal switches typically include ratings of maximum recommended voltage that may be applied across an open source terminal and drain terminal. Application of a voltage greater than the rating of maximum recommended voltage may result in a breakdown of the dielectric strength of the switch, or an arc from one terminal of the open switch to the other terminal of the open switch, thereby allowing an unintended current to pass through the conduction path and possibly damage the switch.

In order to utilize three-terminal switches to control the conduction path across a potential greater than the rating of maximum recommended voltage rating of any one switch, a switching circuit may include a plurality of switches placed in series such that the drain of one switch is series connected to the source of another. Such series arrangements typically include a resistive grading network that includes resistors in parallel with each switch, the resistors having high resistance values selected to reduce current flow and distribute the total open-circuit potential across each switch of the plurality when all of the switches are open.

However, such a series configuration results in a floating source voltage for each switch that is not connected to a reference, such as a ground. Therefore the voltage at the gate of each switch (relative to its respective source) that is required to close the connection between the source and drain differs by the amount of voltage distribution provided by the grading network. This is typically solved by the use of multiple isolated control voltage supplies corresponding to each of the three-terminal switches and provide to the gate and source of each three-terminal switch the appropriate voltage to close the connection between the respective source and terminal. Use of such multiple isolated supplies and their associated controls increases an overall complexity and cost of the switching circuit. Accordingly, there is a need in the art for a switching arrangement that overcomes these drawbacks.

BRIEF DESCRIPTION OF THE INVENTION

An embodiment of the invention includes a circuit for servicing a load connectable with a power supply. The circuit includes a plurality of three-terminal switches and one control supply. The three-terminal switches define a series conduction path connectable between the power supply and the load. Each of the plurality of three terminal switches includes a source terminal, a drain terminal, and a gate terminal. The control supply is productive of a control voltage and in power connection between the gate terminal and source terminal of each of the plurality of three-terminal switches. Each of the plurality of three-terminal switches is responsive to the control voltage at its respective gate terminal to close a connection between the respective source terminal and respective drain terminal of each of the plurality of three-terminal switches.

Another embodiment of the invention includes a method of switching a load connectable with a power supply. The method includes defining a series conduction path that is connectable between the power supply and the load and includes a source terminal and a drain terminal of each of a plurality of three-terminal switches. The method further includes making available a control voltage at a gate terminal of each of the plurality of three-terminal switches from one control supply in power connection between the gate terminal and the source terminal of each of the plurality of three-terminal switches and a source terminal of one of the plurality of three-terminal switches. In response to the control voltage being received at each of the plurality of three-terminal switches at its respective gate terminal, the method includes closing a connection between the respective source terminal and the respective drain terminal of each of the plurality of three-terminal switches.

These and other advantages and features will be more readily understood from the following detailed description of preferred embodiments of the invention that is provided in connection with the accompanying drawings.

BRIEF DESCRIPTION OF THE DRAWINGS

Referring to the exemplary drawings wherein like elements are numbered alike in the accompanying Figures.

DETAILED DESCRIPTION OF THE INVENTION

An embodiment of the invention provides a series three-terminal switching circuit arrangement that utilizes one control voltage supply to control a plurality of three-terminal switches in the series switching circuit. Provision of an isolation circuit allows use of the one control voltage supply. In an embodiment, an arc suppression circuit diverts current flow away from the switch during a change in state of the switch. In another embodiment, a soft-switching circuit synchronizes the change in state of the switch with a zero-crossing of the at least one of an alternating current and an alternating voltage.

Figure 1:
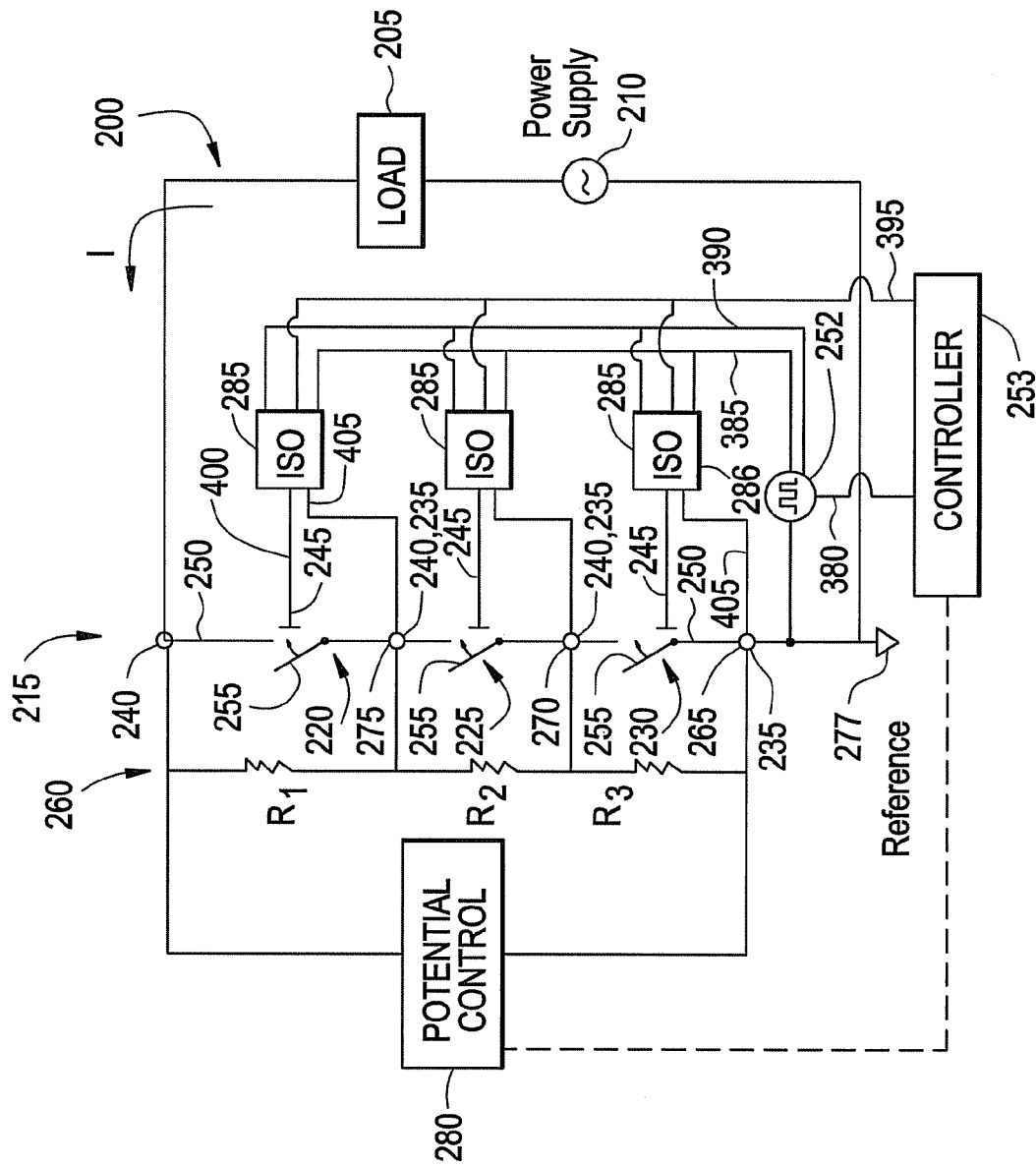
FIG. 1 depicts a schematic diagram of a switching circuit in accordance with an embodiment of the invention.

Referring now to FIG. 1, a schematic diagram of a circuit 200 (also herein referred to as a "switching circuit") for servicing a load 205 connectable with a power supply 210 is depicted. The circuit 200 includes a plurality 215 of three-terminal switches 220, 225, 230. As used herein, reference numeral 215 shall refer to any three-terminal switch in general, as well as the plurality of three-terminal switches, while reference numerals 220, 225, and 230 shall refer to the specific three-terminal switch so indicated.

Each three terminal switch 215 includes a source terminal 235, a drain terminal 240, and a gate terminal 245. The source terminals 235 of switches 220, 225 are connected to the drain terminals 240 of the adjacent switches 225, 230, respectively. It will therefore be appreciated that as depicted, the drain terminal 240 of switch 230 is at the same potential as the source terminal 235 of switch 225, and so on. The plurality of three terminal switches 215 define a series conduction path 250 connectable between the power supply 210 and the load 205, such that the series conduction path 250 includes the source terminal 235 and drain terminal 240 of each of the plurality of three-terminal switches 215.

A control supply 252 is signal communication with a controller 253 and in power connection between the gate terminal 245 of each of the plurality of three-terminal switches 215 and the source terminal 235 of the switch 230. The control supply 252 is responsive to the controller 253 and productive of a control voltage. A connection 255 between the source 235 and the drain 240 of each switch 215 is responsive to application of the control voltage at the gate 245, relative to the respective source 235, to close and thereby change state to conduct a flow of current I through the respective source 235 and drain 240 of each respective switch 215.

It will be appreciated that exemplary three terminal switches 215, such as metal-oxide-semiconductor field-effect transistor (MOSFET), insulated gate bipolar transistor (IGBT), and micro electromechanical system (MEMS) switches for example, may include a maximum recommended open-switch voltage. It is possible to utilize such switches 215 in conjunction with the power supply 210 that exceeds the maximum recommended open-switch voltage by inclusion of a resistive grading network 260, including resistors R1, R2, and R3 connected in series with each other and in parallel with each of the switches 220, 225, 230, respectively. The resistive grading network 260 distributes the potential, or voltage of the supply 210 across the plurality of switches 215 when the switches are in the OPEN state, such that the potential across any one switch 215 does not exceed its maximum recommended open-switch voltage.

By way of clarifying example only, if each switch 215 has a maximum recommended open-switch voltage of 105 volts, and the power supply 210 provides a 300 volt potential, incorporation of the resistive grading network 260 with R1, R2, and R3 each having equal resistance values will provide an open-switch potential across each switch 220, 225, 230 of 100 volts. Accordingly, it will be appreciated that the sources 235 are floating sources, such that sources 235 at circuit nodes 265, 270, 275 each have an open switch potential, relative to a reference 277 such as a ground, of 0 volts, 100 volts, and 200 volts, respectively. Selection of resistance value will define a total current flow I through the resistive grading network 260 while the switches 215 are open. It will be appreciated that for some applications, resistance values of R1, R2, and R3 may be selected high enough such that the flow of current I may be acceptably low to approximate an open circuit between the load 205 and the supply 210.

As described above, each connection 255 is responsive to the control voltage applied at the respective gate 245 relative to the respective source 235 voltage. Therefore, as described above, different control voltages (relative to the reference 277) applied at the gate 245 of each floating source 235 are required to close the connection 255 of each of the switches 215. For example, if a relative voltage of 50 volts is required to close the connection 255, it will be appreciated that the control voltages to close the connections of switches 230, 225, and 220 are 50 volts, 150 volts, and 250 volts, respectively. Therefore, present circuits that include resistive grading networks to distribute potential across a plurality of switches employ multiple isolated control power supplies, with each of the multiple isolated control power supplies providing a different voltage (relative to the reference 277).

An embodiment of the circuit 200 includes a potential control circuit 280, to be described in further detail below, that is in signal communication with and responsive to the controller 253 to significantly reduce the difference in relative potential of each of the nodes 265, 270, 275 during a change in state of the switches 215. Therefore, during a change in state of the switches 215, the potential control circuit 280 reduces the difference in relative potential between the gate 245 and the source 235 of each of the different switches 220, 225, 235. Accordingly, the potential control circuit 280 allows the use of the one control supply 252, productive of one control voltage, in connection with the one source 235 of the switch 230 and the gate 245 of each switch 215.

Furthermore, the potential control circuit 280 resolves two possible issues that may result from breakdown characteristics of the switch 215, both source 235 to drain 240 and gate 245 to drain 240 in response to use of at least one of the power supply 210 and control supply 252 that supply a voltage that exceeds the maximum recommended open-switch voltage. As described above, arrangement of the switches 215 in series, in conjunction with the resistive grading network 260, prevents application of the full potential of the supplies 210, 252 between the source 235 and drain 240 of each switch 215 while the switches 215 are in the open state. The potential control circuit 280 prevents application of the full potential of the supplies 210, 252 to the switches 215 during a change in switch 215 state, as will be described in detail below. For example, the potential control circuit 280 prevents application of the full potential of the supplies 210, 252 to the last switch 215 to close, and allows the circuit 200 to accommodate supplies 210, 252 that have an operating voltage greater than the maximum recommended open-switch voltage of each switch 215.

Additionally, it is noted that a large potential may also exist between the gate 245 and the drain 240 of the last switch 215 to close. By way of illustrative example, it will be assumed that the switch 215 has a maximum recommended open-switch voltage of 105 volts, the control voltage applied by the control supply 252 at the gate 245 relative to the source 235 is 100 volts of direct current, and an application voltage of 300 volts peak of alternating current is supplied by the power supply 210. At the peak negative alternating current voltage of −300 volts, the voltage applied between the gate 245 and drain 240 of the last switch 215 to close will be 500V (300V from the AC line & 200 volts from the gate control). As will be described further below, the potential control circuit 280 also prevents application of such damaging voltage in excess of the maximum recommended open-switch voltage between the gate 245 and the source 235.

While an embodiment of the invention has been described with a potential control circuit separate from, and in signal communication with a controller, it will be appreciated that the scope of the invention is not so limited, and that the invention will also apply to embodiments of switching circuits in which the functions and components of the controller 253 and potential control circuit 280 are integrated together.

As described in the example above, the source terminals 235 are floating, such that sources 235 at circuit nodes 265, 270, 275 each have an open switch potential, relative to a reference 277 such as a ground, of 0 volts, 100 volts, and 200 volts, respectively.

In an embodiment, the circuit further includes an isolation circuit 285 disposed between the control supply 252 and the gate 245 of each switch 215. The isolation circuit 285 operates in conjunction with the control supply 252 and the controller 253 to provide an isolated voltage at the gate terminals 245 of each switch 215, such that an open switch potential between the source 235 and gate 245 of any switch 215 does not exceed the control voltage required to close the connection 255, as will be described further below.

Figure 2:
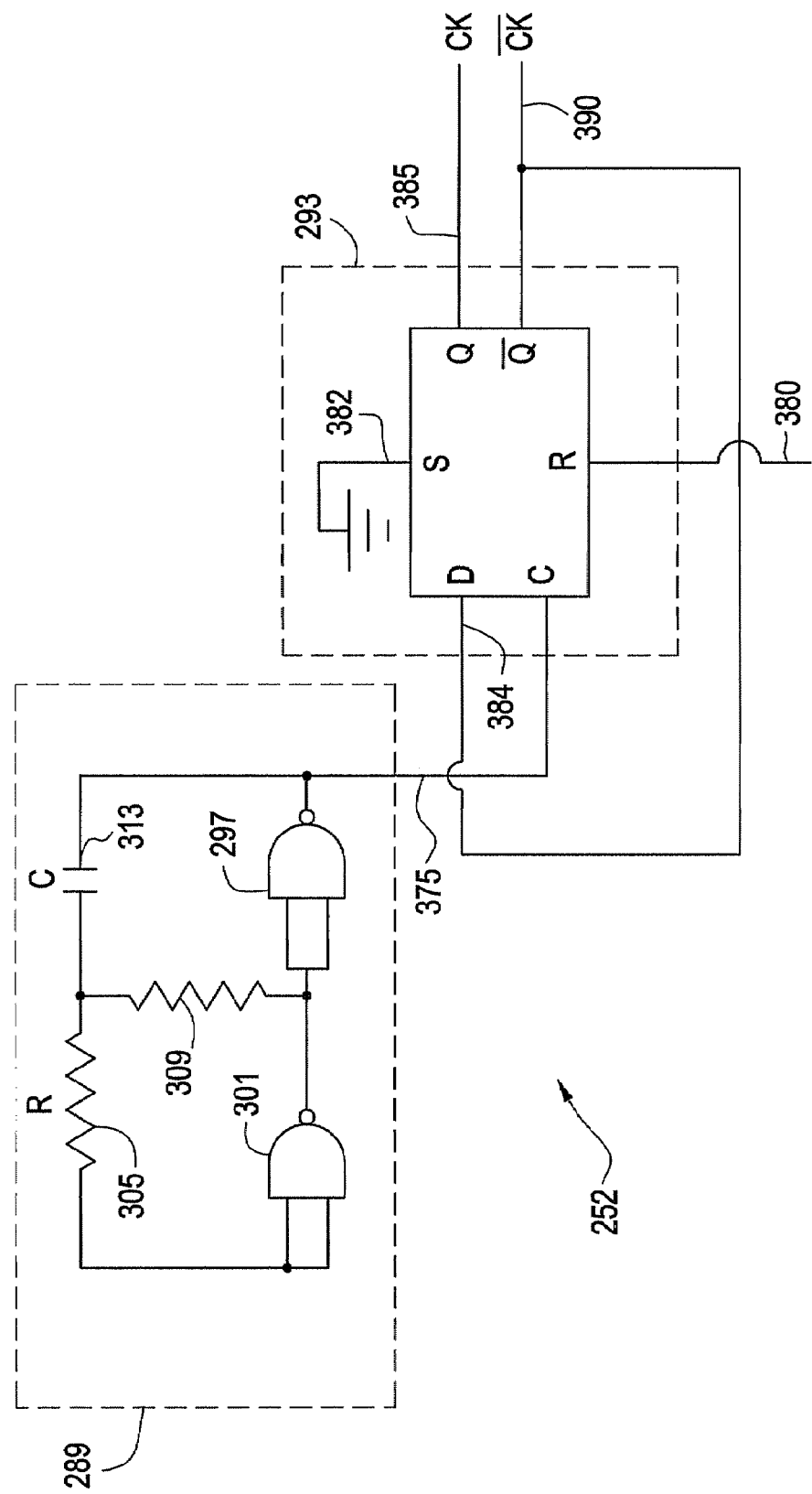
FIG. 2 depicts a schematic diagram of a control supply circuit in accordance with an embodiment of the invention.

FIG. 2 depicts a schematic circuit diagram of one embodiment of the control supply 252. In the embodiment of the control supply 252 depicted in FIG. 2, the control supply 252 is a square wave generator 252. The square wave generator 252 includes an oscillator circuit 289 and a flip-flop circuit 293.

In one embodiment, the oscillator circuit 289 includes two NAND gates 297 & 301, two resistors 305, 309, and a capacitor 313. The resistor 305 is connected in series with the NAND gate 301. The resistor 309 is connected in parallel with resistor 305 and NAND gate 301, as well as capacitor 313 and NAND gate 297. Selection of resistance values of the resistors 305, 309 and a capacitance value of the capacitor 313 determine an operational frequency of the oscillator circuit 289. An output of the oscillator circuit 289 is in signal communication with an input of the flip-flop 293 via connection 375. An enable input 380 is provided by the controller 253 to enable operation of the flip-flop 293. An S input of the flip-flop 293 is connected to ground, and a D input 384 is connected to an output 390. Therefore, as the oscillator circuit 289 changes, the flip-flop 293 changes, creating a square wave at outputs of the flip-flop 293 via connections 385, 390, which is provided to the isolation circuits 285.

Figure 3:
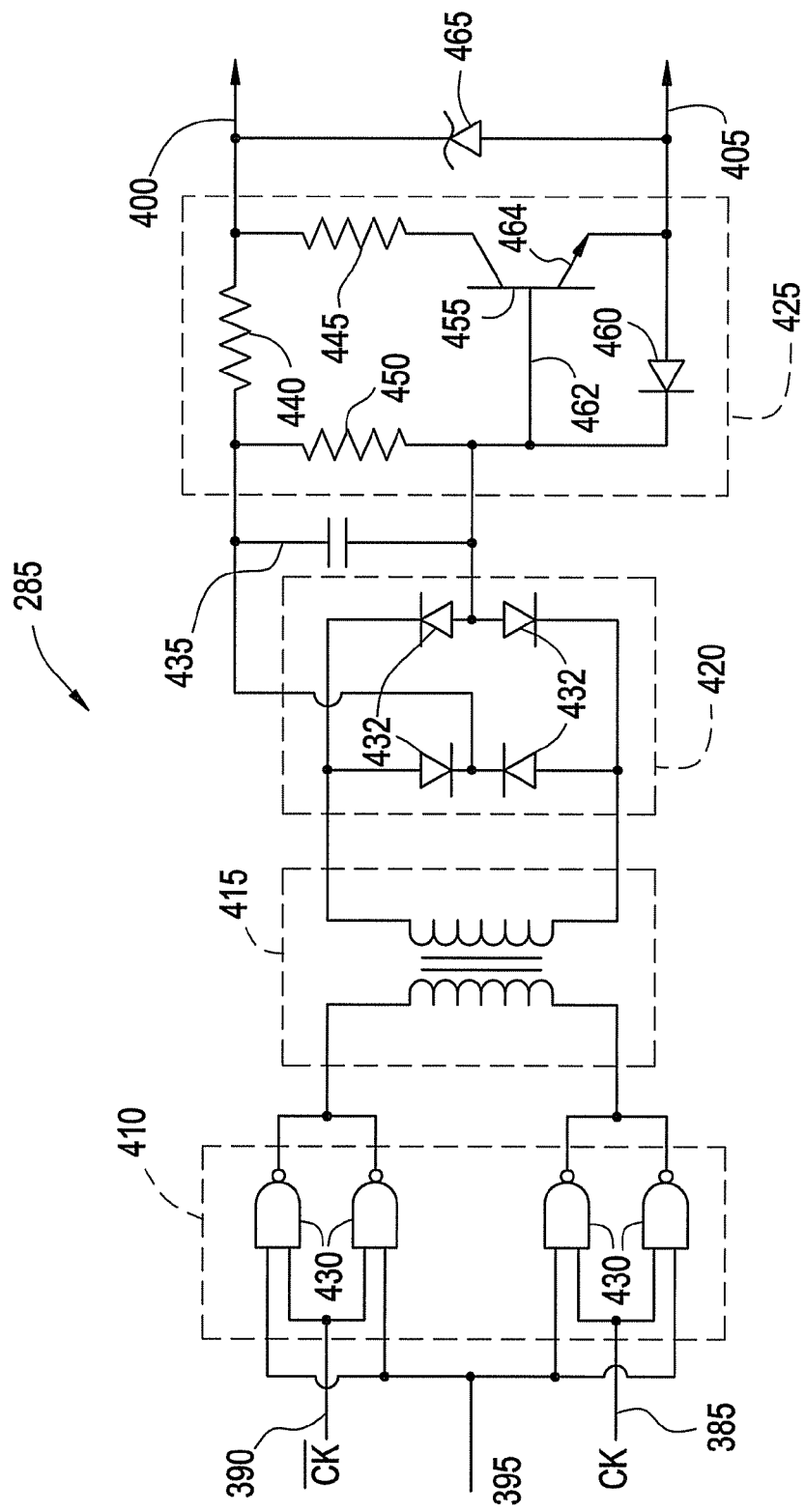
FIG. 3 depicts a schematic diagram of an isolation circuit in accordance with an embodiment of the invention.

FIG. 3 depicts a schematic circuit diagram of one embodiment of the isolation circuit 285. The isolation circuit 285 receives the outputs of the control supply 252 via connections 385, 390 and an enable input 395 from the controller 253, and provides outputs to each gate 245 and source 235 of each switch 215 via connections 400 and 405, respectively. The connections 385, 390 from the control supply 252 provide power, while the input 395 provides control of the output at connections 400, 405. For example, when the isolator circuit 285 receives a high (1) signal from input 395, the output at connections 400, 405 provide the control voltage between the respective source 235 and gate 245 to close the connection 255 of the switch 215. Alternatively, when the isolator circuit 285 receives a low (0) signal from input 395, the output at connections 400, 405 (and thus the source 235 and gate 245 of the respective switch 215) are held at the same potential, such as to prevent an inadvertent closure of the switch 215.

The embodiment of the isolation circuit 285 depicted in FIG. 3 includes a logic circuit 410, a transformer 415, a rectifier 420, and a tuning circuit 425. The logic circuit 410 is responsive to the enable input 395, such that in response to the high signal from input 395, the square wave signal provided by the control supply 252 at connections 385, 390 is passed forward to the transformer 415. Alternatively, if the enable input 395 is low, nothing is passed forward to the transformer 415. In one embodiment, the logic circuit 410 includes 4 NAND gates 430 connected to control supply 252 outputs via the connections 385, 390 and enable input 395 as depicted.

The square wave signal from connections 385, 390 passes through the transformer 415, providing isolation, as well as an appropriate step-up (as determined by an appropriate turns ratio) from the voltage provided by the outputs 385, 390 to the control voltage that is appropriate to be applied between the gate 245 and source 235 of the switch 215 to close the connection 255.

In one embodiment, the rectifier 420 is a full wave bridge rectifier 420 including 4 diodes 432 connected in a bridge circuit as depicted. The bridge rectifier 420 is tuned to the desired potential between the output connections 400, 405, and rectifies the square wave voltage increased by the transformer 415 to a DC voltage signal. A capacitor 435 connected in parallel across outputs of the bridge rectifier 420 may optionally be provided to reduce noise transmission.

The tuning circuit 425 controls the time-dependent behavior associated with the rise (switching on) of voltage as well as the fall (switching off) of voltage between the output connections 400, 405. In one embodiment, the tuning circuit 425 includes a resistor 450 connected in parallel with the outputs of the rectifier 420, another resistor 440 connected between resistor 450 and the gate output connection 400. Another resistor 445 is connected in parallel with the resistor 450 (and the rectifier 420 outputs) through a transistor 455. A diode 460 is connected in series between a base 462 and emitter 464 of the transistor 455. The emitter 464 of the transistor 455 is connected to the source output connection 405.

In an embodiment, a resistance value of resistor 440 controls a delay associated with a turn on time of the control voltage applied between the connections 400, 405. Similarly, a resistance value of resistor 445 controls a delay associated with a turn off time of the control voltage applied between the connections 400, 405.

The resistor 450 provides a discharge path for the capacitor 435. When the output from the diode bridge 420 is removed, diode 460 stops conducting and capacitor 435 discharges through resistor 450. Accordingly, the gate 245 voltage at connection 400 provides base current to transistor 455 via resistors 440 and 450. This influences the turn off time, as the value of current that the transistor 455 can sink is the base current times the transistor gain (for example, a gain of 10 is used when the transistor 455 approaches saturation). The current that the transistor 455 conducts (collector to emitter) is further limited by the resistor 445, which is used to set the turn off time. When turning on, the diode 460 conducts and completes the path from the top of capacitor 435 through resistor 440, through the connections 400, 405, and back to the bottom side of capacitor 435. When the diode 460 is conducting as such, it sets up a reverse base-emitter voltage that ensures that the transistor 455 is turned off. A zener diode 465 may optionally be provided, connected in parallel across the connections 400, 405 to limit the potential between the connections 400, 405.

Accordingly, use of the isolation circuit 285, in conjunction with the control supply 252 facilitates making available the control voltage at the gate terminal 245 relative to the source terminal 235 of each three-terminal switch 215, such that the control voltage between each gate terminal 245 and source terminal 235 is isolated with respect to a potential of the source 235 of any other three terminal switch 215.

In one embodiment, the circuit 200 facilitates closing the connections 255 of the plurality of switches 215 to provide a closed conduction path 250. Following a command signal provided by the controller 253 (to close the connections 255) the control supply 252 generates the control voltage. Selection of appropriate resistance values of the resistor 440 within each isolation circuit 285 influences a delay of the turn-on voltage between the connections 400, 405, such that the control voltage is first applied at the gate 245 of switch 230, relative to the source 235 of switch 230, thereby closing the connection 255 of switch 230, and connecting the drain 240 and source 235 of switch 230. Therefore, because the drain 240 of switch 230 is connected with the source 235 of switch 225 at node 270, the source 235 of switch 225 is at the same potential as the source 235 of switch 230, to which the control supply 252 is connected. Accordingly, following closure of the connection 255 of switch 230, the control supply 252 is in power connection with the source 235 of switch 225 at node 270 via switch 230. Therefore, control supply 252 is capable to close the connection 255 of switch 225 via application of the control voltage to the gate 245 of switch 225 relative to the source 235 of switch 230. It will be appreciated that in similar fashion, following closure of switch 225, the control supply 252 is in power connection with the source 235 of switch 220 at node 275 and likewise capable to close the connection 255 of switch 220. Therefore, selection of appropriate resistance values of the resistor 440 provides a staggered, successive closing of the contacts 255 of the plurality of switches 215, which in conjunction with the potential control circuit 280, allows the use of the single control supply 252, productive of the single control voltage relative to the reference 277. Accordingly, talking into consideration the known or determined closing or reaction time of the switches 215, selection of appropriate resistance values can allow the control voltage to be applied to the gate 245 of each of the plurality of switches 215 in a staggered, successive manner starting from the switch 230, the source 235 of which is in power connection with the control supply 252. Similarly, turning off can be timed by selection of resistance value of the resistor 445.

It will be appreciated that although FIG. 1 and the above discussion describe the circuit 200 having three three-terminal switches 220, 225, and 230, the scope of the invention is not so limited, and the invention will also apply to embodiments of circuits 200 that may employ any number of switches 215 as appropriate to distribute the total potential provided by the supply 210.

It will be further appreciated that alternate circuit 200 arrangements may provide the functionality described herein. For example, in one embodiment, isolation circuit 286 associated with switch 230 may not require an isolation transformer 415, as the source 235 of switch 230 is in direct power connection with the control supply 252. For such an embodiment, the isolation circuit 286 may be configured to include the rectifier circuit 420 absent the logic circuit 410 and tuning circuit 425, for example.

The switching circuit 200 is contemplated to have particular utility in use with three-terminal switches 215 that are MEMS based switches, as described below.

Figure 4:
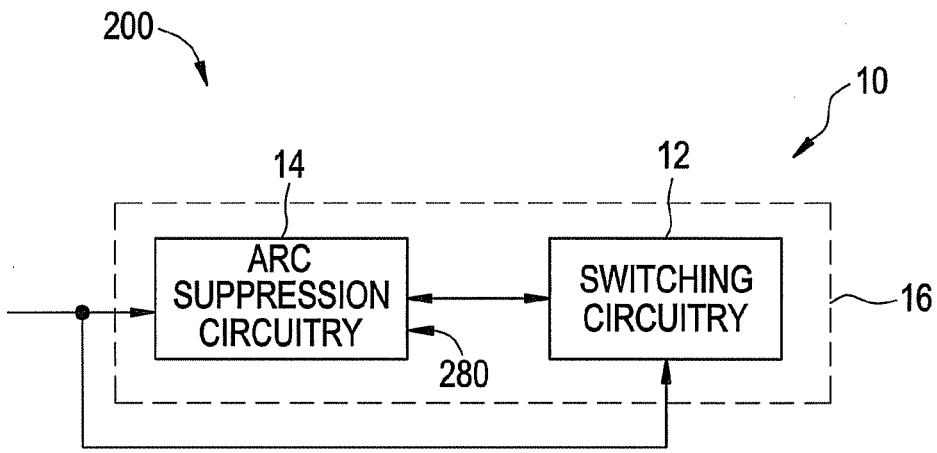
FIG. 4 depicts a block diagram of an arc-less switching system in accordance with an embodiment of the invention.

FIG. 4 illustrates a block diagram of an exemplary circuit 200 utilizing an arc-less switching system 10, which may utilize MEMS based switches 215 in accordance with aspects of the present invention. Presently, MEMS generally refers to micron-scale structures that for example can integrate a multiplicity of functionally distinct elements, for example, mechanical elements, electromechanical elements, sensors, actuators, and electronics, on a common substrate through micro-fabrication technology. It is contemplated, however, that many techniques and structures presently available in MEMS devices will in just a few years be available via nanotechnology-based devices, for example, structures that may be smaller than 100 nanometers in size. Accordingly, even though following example embodiments may refer to MEMS-based switching devices, it is submitted that the inventive aspects of the present invention should be broadly construed and should not be limited to micron-sized devices.

As illustrated in FIG. 4, an embodiment of the circuit 200 utilizing the arc-less switching system 10 is shown as including switching circuitry 12 and an embodiment of the potential control circuit 280 including arc suppression circuitry 14, where the arc suppression circuitry 14, alternatively referred to Hybrid Arcless Limiting Technology (HALT), is operatively coupled to the switching circuitry 12. In certain embodiments, the switching circuitry 12 may be integrated in its entirety with the arc suppression circuitry 14 in a single package 16, for example. In other embodiments, only certain portions or components of the switching circuitry 12 may be integrated with the arc suppression circuitry 14.

Figure 5:
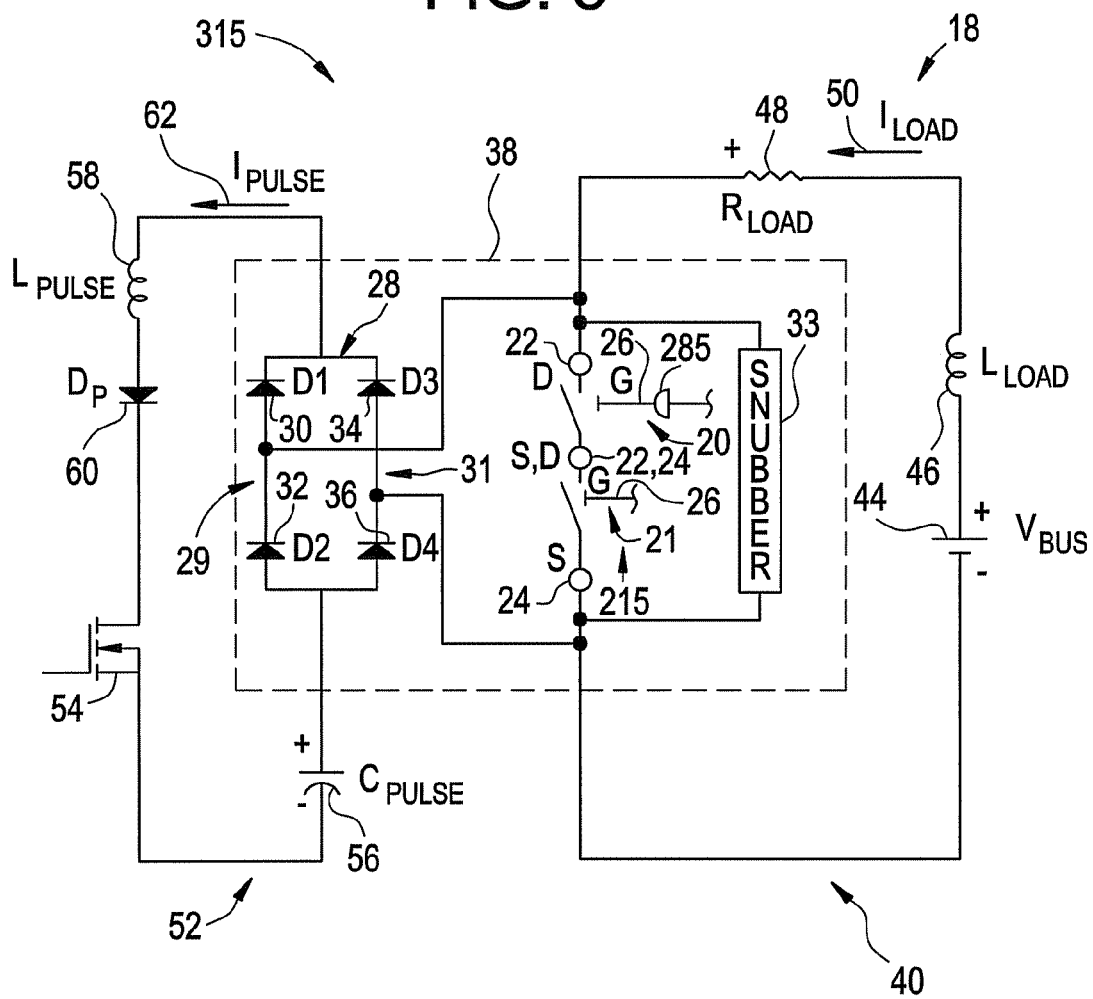
FIG. 5 depicts a schematic diagram of a switching circuit including an arc suppression circuit in accordance with an embodiment of the invention.

FIG. 5 depicts a presently contemplated configuration of a switching circuit 315 that includes the plurality of switches 215 with particular attention to interaction of the switches 215 with the arc suppression circuitry 14. It will be appreciated that the resistive grading network 260 and control supply 252, as described above in reference to FIG. 1, are part of the circuit 315 of FIG. 5, but are not depicted for clarity of illustration. Additionally, the arc suppression circuitry 14 may include a balanced diode bridge and a pulse circuit. Further, the arc suppression circuitry 14 may be configured to facilitate suppression of an arc formation between contacts of the switches 215. It may be noted that the arc suppression circuitry 14 may be configured to facilitate suppression of an arc formation in response to an alternating current (AC) or a direct current (DC).

A schematic diagram 18 of the exemplary switching system depicted in FIG. 4 is depicted in FIG. 5 in accordance with one embodiment. In an embodiment, the switches 215 include a first MEMS switch 20 and second MEMS switch 21, which are depicted as each having a first contact 22, a second contact 24 and a third contact 26. In one embodiment, the first contact 22 may be configured as a drain, the second contact 24 may be configured as a source and the third contact 26 may be configured as a gate. Furthermore, as illustrated in FIG. 5, a voltage snubber circuit 33 may be coupled in parallel with the MEMS switches 20, 21 and configured to limit voltage overshoot during fast contact separation as will be explained in greater detail hereinafter. In certain embodiments, the snubber circuit 33 may include a snubber capacitor (see 76, FIG. 7) coupled in series with a snubber resistor (see 78, FIG. 7). The snubber capacitor may facilitate improvement in transient voltage sharing during the sequencing of the opening of the MEMS switches 20, 21. Furthermore, the snubber resistor may suppress any pulse of current generated by the snubber capacitor during closing operation of the MEMS switches 20, 21. In certain other embodiments, the voltage snubber circuit 33 may include a metal oxide varistor (MOV) (not shown).

In accordance with further aspects of the present technique, a load circuit 40 may be coupled in series with the MEMS switches 20, 21. The load circuit 40 may include a voltage source $V_{BUS}$ 44. In addition, the load circuit 40 may also include a load inductance 46 $L_{LOAD}$, where the load inductance $L_{LOAD}$ 46 is representative of a combined load inductance and a bus inductance viewed by the load circuit 40. The load circuit 40 may also include a load resistance $R_{LOAD}$ 48 representative of a combined load resistance viewed by the load circuit 40. Reference numeral 50 is representative of a load circuit current $I_{LOAD}$ that may flow through the load circuit 40 and the MEMS switches 20, 21.

Further, as noted with reference to FIG. 4, the arc suppression circuitry 14 may include a balanced diode bridge. In the illustrated embodiment, a balanced diode bridge 28 is depicted as having a first branch 29 and a second branch 31. As used herein, the term "balanced diode bridge" is used to represent a diode bridge that is configured such that voltage drops across both the first and second branches 29, 31 are substantially equal, and thereby significantly reduce the difference in relative potential between the gate 26 of switch 20 and source 24 of switch 21, as described above. The first branch 29 of the balanced diode bridge 28 may include a first diode D1 30 and a second diode D2 32 coupled together to form a first series circuit. In a similar fashion, the second branch 31 of the balanced diode bridge 28 may include a third diode D3 34 and a fourth diode D4 36 operatively coupled together to form a second series circuit.

In one embodiment, the MEMS switches 20, 21 may be coupled in parallel across midpoints of the balanced diode bridge 28. The midpoints of the balanced diode bridge may include a first midpoint located between the first and second diodes 30, 32 and a second midpoint located between the third and fourth diodes 34, 36. Furthermore, the MEMS switches 20, 21 and the balanced diode bridge 28 may be tightly packaged to facilitate minimization of parasitic inductance caused by the balanced diode bridge 28 and in particular, the connections to the MEMS switches 20, 21. It may be noted that, in accordance with exemplary aspects of the present technique, the MEMS switches 20, 21 and the balanced diode bridge 28 are positioned relative to one another such that the inherent inductance between the MEMS switches 20, 21 and the balanced diode bridge 28 produces a di/dt voltage less than a few percent of the voltage across the drain 22 of the MEMS switch 20 and source 24 of the MEMS switch 21 when carrying a transfer of the load current to the diode bridge 28 during the MEMS switches 20, 21 turn-off which will be described in greater detail hereinafter. In one embodiment, the MEMS switches 20, 21 may be integrated with the balanced diode bridge 28 in a single package 38 or optionally, the same die with the intention of minimizing the inductance interconnecting the MEMS switches 20, 21 and the diode bridge 28.

Additionally, the arc suppression circuitry 14 may include a pulse circuit 52 coupled in operative association with the balanced diode bridge 28. The pulse circuit 52 may be responsive to controller 253 (best seen with reference to FIG. 1) to detect a switch condition and initiate staggered, successive opening of the MEMS switches 20, 21 as described above responsive to the switch condition. As used herein, the term "switch condition" refers to a condition that triggers changing a present operating state of the MEMS switches 20, 21. For example, the switch condition may result in changing a first closed state of the MEMS switches 20, 21 to a second open state or a first open state of the MEMS switches 20, 21 to a second closed state. A switch condition may occur in response to a number of actions including but not limited to a circuit fault or switch ON/OFF request.

The pulse circuit 52 may include a pulse switch 54 and a pulse capacitor $C_{PULSE}$ 56 series coupled to the pulse switch 54. Further, the pulse circuit may also include a pulse inductance $L_{PULSE}$ 58 and a first diode $D_P$ 60 coupled in series with the pulse switch 54. The pulse inductance $L_{PULSE}$ 58, the diode $D_P$ 60, the pulse switch 54 and the pulse capacitor $C_{PULSE}$ 56 may be coupled in series to form a first branch of the pulse circuit 52, where the components of the first branch may be configured to facilitate pulse current shaping and timing. Also, reference numeral 62 is representative of a pulse circuit current $I_{PULSE}$ that may flow through the pulse circuit 52.

In accordance with aspects of the present invention, the MEMS switches 20, 21 may be rapidly switched (for example, on the order of picoseconds or nanoseconds) from a first closed state to a second open state while carrying a current albeit at a near-zero voltage, as provided by the arc suppression circuitry 14 of the potential control circuit 280. This may be achieved through the combined operation of the load circuit 40, and pulse circuit 52 including the balanced diode bridge 28 coupled in parallel across contacts of the MEMS switches 20, 21.

Figure 6:
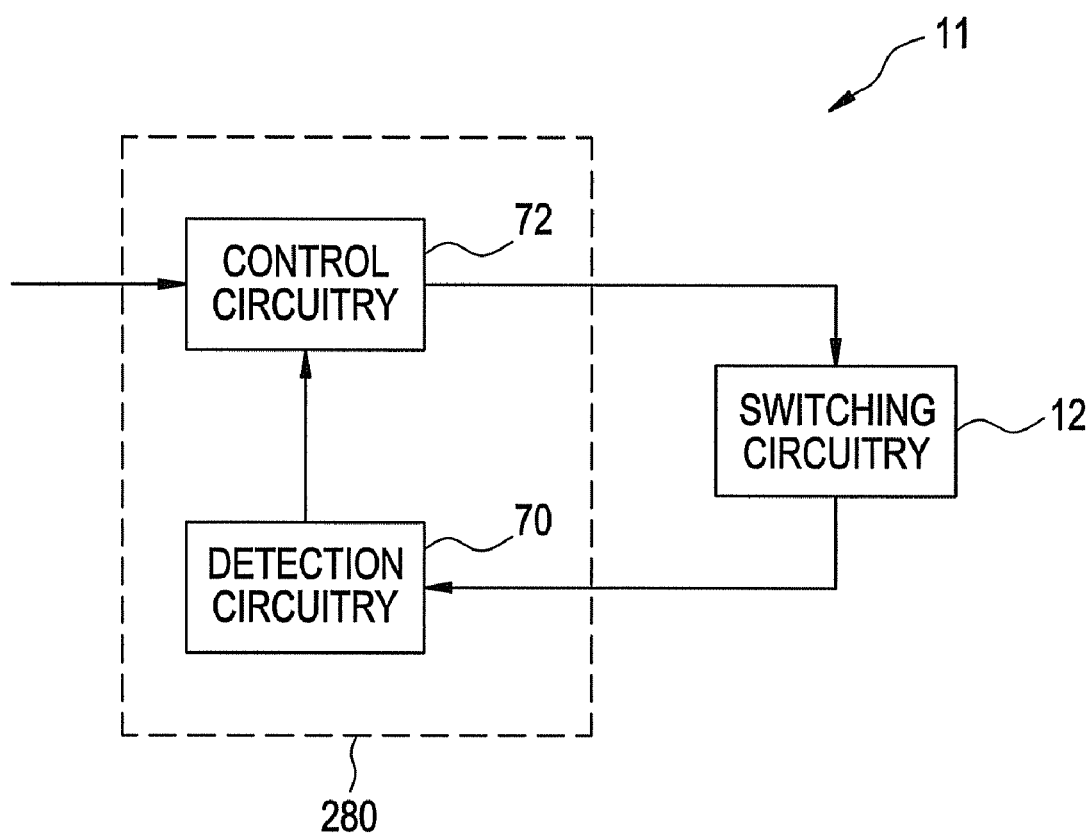
FIG. 6 depicts a block diagram of a soft switching system in accordance with an embodiment of the invention.

Reference is now made to FIG. 6, which illustrates a block diagram of an exemplary soft switching system 11, in accordance with aspects of the present invention. As illustrated in FIG. 6, the soft switching system 11 includes switching circuitry 12, operatively coupled with an alternate embodiment of the potential control circuit 280, including detection circuitry 70 and control circuitry 72. The detection circuitry 70 may be coupled to the switching circuitry 12 and configured to detect an occurrence of a zero crossing of an alternating source voltage in a load circuit (hereinafter "source voltage") or an alternating current in the load circuit (hereinafter referred to as "load circuit current"). The control circuitry 72 may be coupled to the switching circuitry 12 and the detection circuitry 70, and may be configured to facilitate arc-less switching of one or more switches in the switching circuitry 12 responsive to a detected zero crossing of the alternating source voltage or the alternating load circuit current such that the difference in relative potential between the gate 26 of switch 20 and source 24 of switch 21 are reduced, (best seen with reference to FIG. 5, as described above). In one embodiment, the control circuitry 72 may be configured to facilitate arc-less switching of the plurality of switches 215 comprising at least part of the switching circuitry 12.

In accordance with one aspect of the invention, the soft switching system 11 may be configured to perform soft or point-on-wave (PoW) switching whereby the plurality of switches 215 in the switching circuitry 12 may be closed at a time when the voltage across the switching circuitry 12 (including nodes 265, 270, 275 shown in FIG. 1, for example) is at or very close to zero, and opened at a time when the current through the switching circuitry 12 is at or close to zero. By closing the switches at a time when the voltage across the switching circuitry 12 is at or very close to zero, the single control voltage supplied by the single control source 252 may be used at each switch 215 to close its respective connection 255, as described above. Furthermore, pre-strike arcing can be avoided by keeping the electric field low between the contacts of the plurality of switches 215 as they close, even if multiple switches do not all close at the same time. Similarly, by opening the switches at a time when the current through the switching circuitry 12 is at or close to zero, the soft switching system 11 can be designed so that the current in the last switch to open in the switching circuitry 12 falls within the design capability of the switch. The control circuitry 72 is configured to synchronize the opening and closing of the plurality of switches 215 of the switching circuitry 12 with the occurrence of a zero crossing of an alternating source voltage or an alternating load circuit current.

Figure 7:
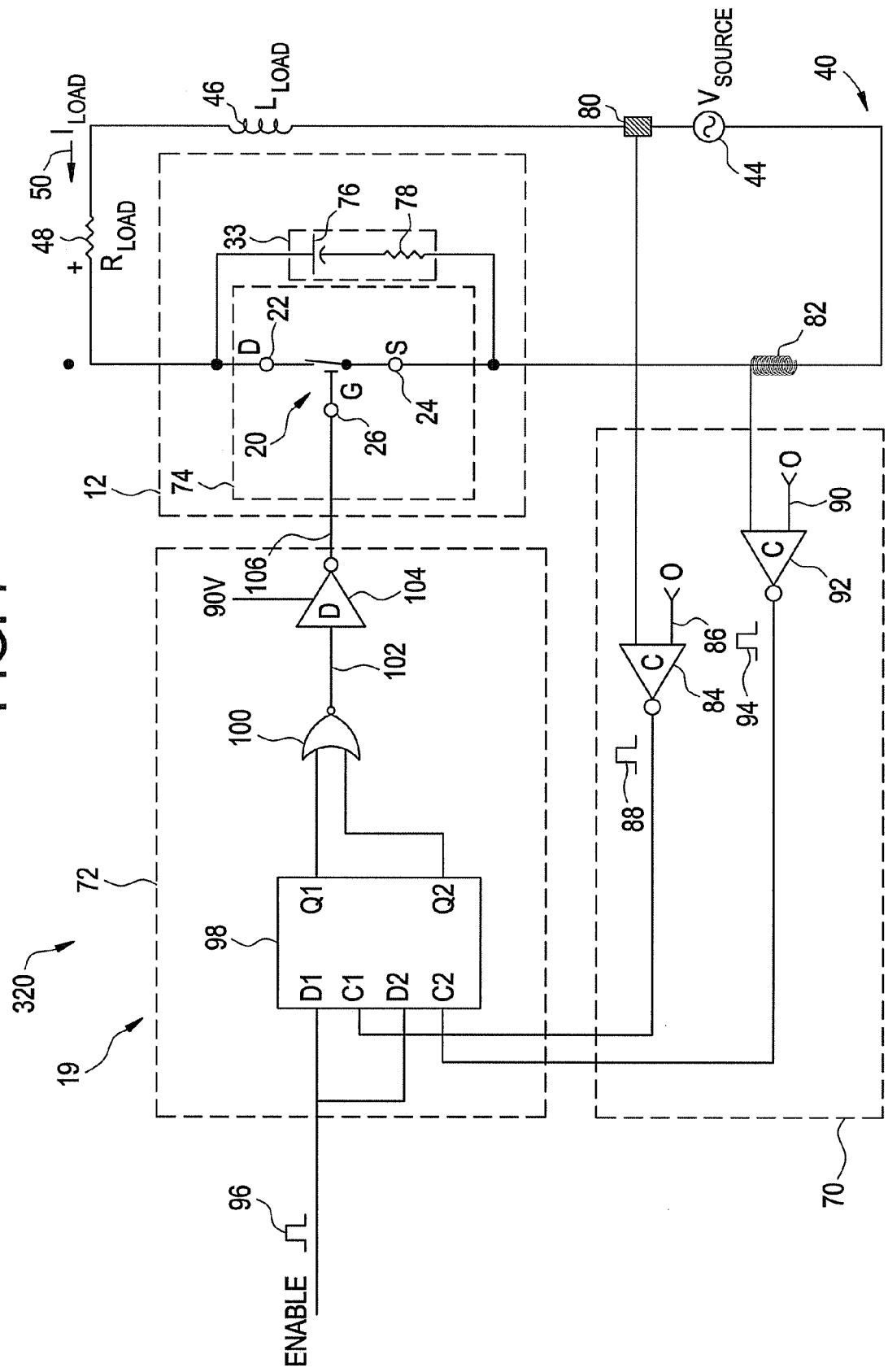
FIG. 7 depicts a schematic diagram of a switching circuit including a soft switching system in accordance with an embodiment of the invention.

Turning to FIG. 7, a schematic diagram 19 of one embodiment of a switching circuit 320 including the soft switching system 11 of FIG. 6 is illustrated. In accordance with the illustrated embodiment, the schematic diagram 19 includes one example of the switching circuitry 12, the detection circuitry 70 and the control circuitry 72. It will be appreciated that the resistive grading network 260 and control supply 252 including the isolation circuits 285, as described above in reference to FIG. 1, are part of the circuit 320 of FIG. 7, but are removed for clarity of illustration.

Although for the purposes of description, FIG. 7 illustrates only a single three-terminal switch 20, such as a MEMS switch 20 in switching circuitry 12, it will be appreciated that in accordance with embodiments of the invention, the switching circuitry 12 will include multiple switches 20 depending upon, for example, the current and voltage handling requirements of the soft switching system 11. In one embodiment, the switching circuitry 12 may include an array of MEMS switches coupled in a series configuration to divide the voltage amongst the MEMS switches as described above with reference to FIG. 1.

In a further embodiment, the switching circuitry 12 may include a switch module including multiple MEMS switches coupled together in a parallel configuration to divide the current amongst the MEMS switches. In yet a further embodiment, the switching circuitry 12 may include an array of MEMS switch modules coupled together in a series configuration to concurrently divide the voltage amongst the MEMS switch modules and divide the current amongst the MEMS switches in each module. In one embodiment, the one or more MEMS switches of the switching circuitry 12 may be integrated into a single package 74.

As described above, the exemplary MEMS switch 20 may include three contacts. In one embodiment, a first contact may be configured as a drain 22, a second contact may be configured as a source 24, and the third contact may be configured as a gate 26. In one embodiment, the control circuitry 72 may be coupled to the gate contact 26 to facilitate switching a current state of the MEMS switch 20. Also, in certain embodiments, damping circuitry (snubber circuit) 33 may be coupled in parallel with the MEMS switch 20 to delay appearance of voltage across the MEMS switch 20. As illustrated, the damping circuitry 33 may include a snubber capacitor 76 coupled in series with a snubber resistor 78, for example.

Additionally, the MEMS switch 20 may be coupled in series with a load circuit 40 as further illustrated in FIG. 7. In a presently contemplated configuration, the load circuit 40 may include a voltage source $V_{SOURCE}$ 44, and may possess a representative load inductance $L_{LOAD}$ 46 and a load resistance $R_{LOAD}$ 48. In one embodiment, the voltage source $V_{SOURCE}$ 44 (also referred to as an AC voltage source) may be configured to generate the alternating source voltage and the alternating load current $I_{LOAD}$ 50

As previously noted, the detection circuitry 70 may be configured to detect occurrence of a zero crossing of the alternating source voltage or the alternating load current $I_{LOAD}$ 50 in the load circuit 40. The alternating source voltage may be sensed via the voltage sensing circuitry 80 and the alternating load current $I_{LOAD}$ 50 may be sensed via the current sensing circuitry 82. The alternating source voltage and the alternating load current may be sensed continuously or at discrete periods for example.

A zero crossing of the source voltage may be detected through, for example, use of a comparator such as the illustrated zero voltage comparator 84. The voltage sensed by the voltage sensing circuitry 80 and a zero voltage reference 86 may be employed as inputs to the zero voltage comparator 84. In turn, an output signal 88 representative of a zero crossing of the source voltage of the load circuit 40 may be generated. Similarly, a zero crossing of the load current $I_{LOAD}$ 50 may also be detected through use of a comparator such as the illustrated zero current comparator 92. The current sensed by the current sensing circuitry 82 and a zero current reference 90 may be employed as inputs to the zero current comparator 92. In turn, an output signal 94 representative of a zero crossing of the load current $I_{LOAD}$ 50 may be generated.

The control circuitry 72, may in turn utilize the output signals 88 and 94 to determine when to change (for example, open or close) the current operating state of the MEMS switch 20 (or array of MEMS switches). More specifically, the control circuitry 72 may be configured to facilitate opening of the array of MEMS switches 20 (such as the plurality of switches 215 depicted in FIG. 1 and switches 20 and 21 depicted in FIG. 5) in a staggered, successive arc-less manner to interrupt or open the load circuit 40 responsive to a detected zero crossing of the alternating load current $I_{LOAD}$ 50. Additionally, the control circuitry 72 may be configured to facilitate closing of the array MEMS switch 20 in a staggered, successive arc-less manner to complete the load circuit 40 responsive to a detected zero crossing of the alternating source voltage.

In one embodiment, the control circuitry 72 may determine whether to switch the present operating state of the MEMS switch 20 to a second operating state based at least in part upon a state of an Enable signal 96. The Enable signal 96 may be generated as a result of a power off command in a contactor application, for example. In one embodiment, the Enable signal 96 and the output signals 88 and 94 may be used as input signals to a dual D flip-flop 98 as shown. These signals may be used to close the MEMS switch 20 at a first source voltage zero after the Enable signal 96 is made active (for example, rising edge triggered), and to open the MEMS switch 20 at the first load current zero after the Enable signal 96 is deactivated (for example, falling edge triggered). With respect to the illustrated schematic diagram 19 of FIG. 4, every time the Enable signal 96 is active (either high or low depending upon the specific implementation) and either output signal 88 or 94 indicates a sensed voltage or current zero, a trigger signal 172 may be generated. In one embodiment, the trigger signal 172 may be generated via a NOR gate 100, for example. The trigger signal 102 may in turn be passed through a MEMS gate driver 104 to generate a gate activation signal 106 which may be used to apply a control voltage to the gate 26 of the MEMS switch 20 (or gates in the case of the MEMS array).

While an embodiment of the invention has been described having the potential control circuit 280 including at least one of the arc suppression circuitry 14 and the soft-switching system 11 in conjunction with MEMS switches, it will be appreciated that the scope of the invention is not so limited, and that the invention will also apply to embodiments of switching circuits that include the potential control 280 in conjunction with a plurality of alternate three-terminal switches, such as MOSFET, and IGBT switches, for example.

Figure 8:
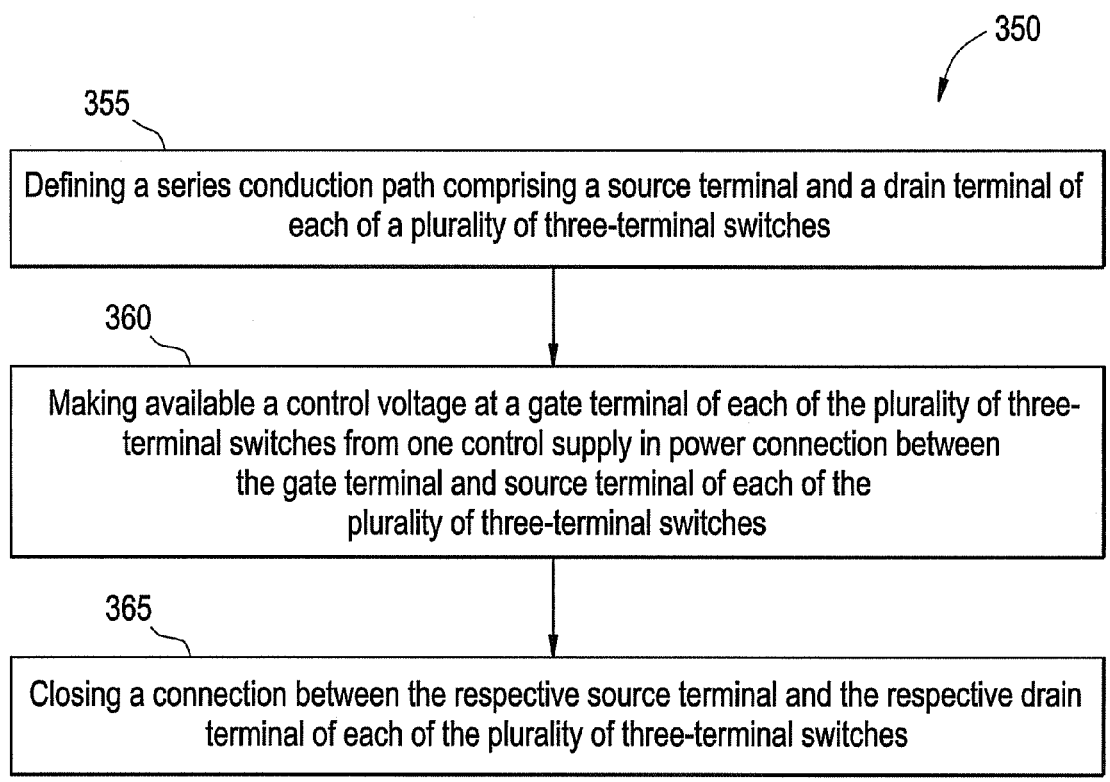
FIG. 8 depicts a flowchart of process steps for switching a load connectable with a power supply in accordance with an embodiment of the invention.

FIG. 8 depicts a flowchart 350 of process steps for switching a load, such as the load 205, connectable with a power supply, such as the power supply 210.

With reference to FIG. 8 in conjunction with FIG. 1, an embodiment of the process begins by defining at Step 355 the series conduction path 250 connectable between the power supply 210 and the load 205, including the source terminal 235 and drain terminal 240 of each of the plurality of three-terminal switches 215. The process continues with malting available, at Step 360 the control voltage at the gate terminal 245 of each of the plurality of three-terminal switches 215 by the control supply 252 in power connection between the gate terminal 245 and the source terminal 235 of each of the plurality of three-terminal switches 215. The process concludes with closing, at Step 365 the connection 255 between the respective source terminal 235 and the respective drain terminal 240 of each of the plurality of three-terminal switches 215 in response to the control voltage being received at each three-terminal switches 215 at its respective gate terminal 245.

One embodiment includes malting available the control voltage at the gate terminal 245 relative to the source terminal 235 of each of the plurality of three-terminal switches 215, the control voltage between each gate terminal 245 and source terminal 235 of each of the plurality of three terminal switches 215 isolated with respect to a potential of the source 235 of any other three terminal switch 215 of the plurality of three terminal switches 215.

In an embodiment, the malting available the control voltage at Step 360 utilizes only one control supply 252 that is in parallel connection with the gate terminals 245 of each of the plurality of three-terminal switches 215. The making available, at Step 360 further includes delaying in time the control voltage at successive gate terminals 245 of the plurality of three-terminal switches 315.

An embodiment of the invention further includes changing the plurality of three-terminal switches 215 from a first state to a second state, such as from an OPEN state to a CLOSED state or a CLOSED state to an OPEN state and in response to the changing of state of the switches, diverting, or receiving a transfer of electrical energy from the series conduction path 250 into the arc suppression circuit 14 of the potential control circuit 280 disposed in parallel connection with the plurality of three-terminal switches 215. Another embodiment further includes synchronizing the change in state of the plurality of three-terminal switches 215 with the occurrence of a zero crossing of at least one of an alternating current passing through the series conduction path 250 and an alternating voltage of the series conduction path 250 relative to the reference 270. Another embodiment of the invention includes controlling the plurality of switches 305, 310 in serial connection between the control supply 300 and the gate terminal 245 of each of the plurality of three-terminal switches 215.

As disclosed, some embodiments of the invention may include some of the following advantages: the use of a single power supply to provide a single control voltage to a plurality of three-terminal switches in a series network; increased circuit voltage capacity at reduced cost; and increased circuit voltage capacity with a reduced complexity.

While the invention has been described with reference to exemplary embodiments, it will be understood that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best or only mode contemplated for carrying out this invention, but that the invention will include all embodiments falling within the scope of the appended claims. Also, in the drawings and the description, there have been disclosed exemplary embodiments of the invention and, although specific terms may have been employed, they are unless otherwise stated used in a generic and descriptive sense only and not for purposes of limitation, the scope of the invention therefore not being so limited. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A circuit for servicing a load connectable with a power supply, the circuit comprising:

a plurality of three-terminal switches which define a series conduction path connectable between the power supply and the load, the series conduction path comprising a source terminal and a drain terminal of each of the plurality of three-terminal switches, and each source terminal of the plurality of three-terminal switches is connected to a drain terminal of an adjacent three-terminal switch, respectively;

one control supply in power connection between a gate terminal of each of the plurality of three-terminal switches and a source terminal of one of the plurality of three-terminal switches, the control supply producing a control voltage; and a plurality of isolator circuits corresponding to the plurality of three-terminal switches, and each disposed in power connection between the one control supply and a source terminal and a gate terminal of each of the three-terminal switches of the plurality of three-terminal switches, and comprising a transformer which transforms the control voltage received from the one control supply at the respective three-terminal switch into a specified voltage to close the respective three-terminal switch, and each of the plurality of three-terminal switches is responsive to the control voltage at its respective gate terminal, thereby closing a connection between the respective source terminal and respective drain terminal of each of the plurality of three-terminal switches based on the specified voltage.

2. The circuit of claim 1, wherein the one control supply comprises only one control supply in parallel connection with the gate terminals of each of the plurality of three-terminal switches.

3. The circuit of claim 1, wherein the one control supply comprises a square wave generator.

4. The circuit of claim 3, wherein the square wave generator comprises:

an oscillator circuit; and a flip-flop circuit in signal communication with an output of the oscillator circuit.

5. The circuit of claim 1, wherein each isolator circuit receives outputs from the control supply and an enable input from a controller, and provides outputs to the gate terminal and the source terminal of each of the three-terminal switches of the plurality of three-terminal switches, wherein when the isolator circuit receives a high signal from the enable input, the isolator circuit provides the control voltage between the gate terminal and the source terminal of the respective three-terminal switch to close the respective three-terminal switch, and when the isolator circuit receives a low signal from the enable input, the source terminal and the gate terminal of the respective switch are held at a same potential.

6. The circuit of claim 1, further comprising:

a controller in signal communication with the control supply;

wherein the isolator circuit further comprises:

a logic circuit in power connection with the control supply and in signal communication with the controller;

the transformer in power connection with the logic circuit;

a rectifier in power connection with the transformer; and a tuning circuit in power connection with the rectifier and the source terminal and the gate terminal of the three-terminal switch.

7. The circuit of claim 6, wherein the tuning circuit comprises:

a first resistor in series connection with the gate terminal of the three-terminal switch;

a second resistor in series connection with a transistor, the second resistor and the transistor in parallel connection with the gate terminal and the source terminal of the three-terminal switch; and a third resistor in series connection with a diode, the third resistor and the diode in parallel connection with the gate terminal and the source terminal of the three-terminal switch.

8. The circuit of claim 1, wherein the plurality of three-terminal switches comprises a plurality of micro electromechanical system (MEMS) switches.

9. The circuit of claim 1, wherein the plurality of three-terminal switches comprises at least one of a metal-oxide-semiconductor field-effect transistor (MOSFET), an insulated gate bipolar transistor (IGBT), or a combination thereof.

10. The circuit of claim 1, further comprising an arc suppression circuit disposed in parallel connection with the plurality of three-terminal switches to receive a transfer of electrical energy from the series conduction path in response to a switch condition changing the plurality of three-terminal switches from a first state to a second state.

11. The circuit of claim 1, further comprising a soft-switching circuit to synchronize a change in state of the plurality of three-terminal switches with an occurrence of a zero crossing of at least one of an alternating current passing through the series conduction path and an alternating voltage of the conduction path relative to an absolute zero reference.

12. A method for switching a load connectable with a power supply, the method comprising:
defining a series conduction path comprising a source terminal and a drain terminal of each of a plurality of three-terminal switches, each source terminal of the plurality of three-terminal switches is connected to a drain terminal of an adjacent three-terminal switch, respectively, the series conduction path being connectable between the power supply and the load;
making available a control voltage at a gate terminal of each of the plurality of three-terminal switches from one control supply in power connection between each gate terminal of the plurality of three-terminal switches and a source terminal of one of the plurality of three-terminal switches wherein the making available a control voltage is via a plurality of isolator circuits corresponding to the plurality of three-terminal switches, each isolator circuit disposed in power connection between the one control supply and the source terminal and the gate terminal of each of the three-terminal switches of the plurality of three-terminal switches, and transforming, via a transformer, the control voltage received from the one control supply at the respective three-terminal switch into a specified voltage to close the respective three-terminal switch; and
in response to the control voltage being received at each of the plurality of three-terminal switches at its respective gate terminal, closing a connection between the respective source terminal and the respective drain terminal of each of the plurality of three-terminal switches based on the specified voltage.

13. The method of claim 12, wherein the making available comprises making available the control voltage at the gate terminal of each of the plurality of three-terminal switches by only one control supply in parallel connection with the gate terminals of each of the plurality of three-terminal switches.

14. The method of claim 12, wherein the making available comprises delaying in time the control voltage at successive gate terminals of the plurality of three-terminal switches.

15. The method of claim 12, wherein the defining comprises defining a series conduction path comprising a plurality of micro electromechanical system (MEMS) switches.

16. The method of claim 12, wherein the defining comprises defining a series conduction path comprising at least one of a metal-oxide-semiconductor field-effect transistor (MOSFET), an insulated gate bipolar transistor (IGBT), or a combination thereof.

17. The method of claim 12, further comprising:
changing the plurality of three-terminal switches from a first state to a second state; and
in response to the changing, receiving a transfer of electrical energy from the series conduction path into an arc suppression circuit disposed in parallel connection with the plurality of three-terminal switches.

18. The method of claim 12, further comprising:
synchronizing a change in state of the plurality of three-terminal switches with an occurrence of a zero crossing of at least one of an alternating current passing through the series conduction path and an alternating voltage of the series conduction path relative to a reference.

19. The method of claim 12, wherein the making available comprises:
making available a control voltage at the gate terminal relative to the source terminal of each of the plurality of three-terminal switches, the control voltage between each gate terminal and source terminal of each of the plurality of three-terminal switches isolated with respect to a potential of the source terminal of any other three-terminal switch of the plurality of three-terminal switches.

* * * * *

UNITED STATES PATENT AND TRADEMARK OFFICE
CERTIFICATE OF CORRECTION

PATENT NO. : 7,508,096 B1
APPLICATION NO. : 11/858402
DATED : March 24, 2009
INVENTOR(S) : Kumfer et al.

Page 1 of 1

It is certified that error appears in the above-identified patent and that said Letters Patent is hereby corrected as shown below:

On Page 2, in Field (56), under "OTHER PUBLICATIONS" in Column 2, Line 44, delete "Permerlani;" and insert -- Premerlani; --, therefor.

In Column 7, Line 23, delete "talking" and insert -- taking --, therefor.

In Column 12, Line 53, delete "malting" and insert -- making --, therefor

In Column 12, Line 65, delete "malting" and insert -- making --, therefor.

In Column 13, Line 6, delete "malting" and insert -- making --, therefor.

Signed and Sealed this

Second Day of June, 2009

JOHN DOLL
*Acting Director of the United States Patent and Trademark Office*